US006255042B1

(12) United States Patent
Fiebag et al.

(10) Patent No.: US 6,255,042 B1
(45) Date of Patent: *Jul. 3, 2001

(54) DEVELOPING SYSTEM FOR ALKALINE-DEVELOPABLE LITHOGRAPHIC PRINTING PLATES WITH DIFFERENT INTERLAYERS

(75) Inventors: Ulrich Fiebag, Nienstadt; Tondock Uwe, Osterode/Nienstadt, both of (DE)

(73) Assignee: Kodak Polychrome Graphics, LLC, Norwalk, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 13 days.

(21) Appl. No.: 09/449,074

(22) Filed: Nov. 24, 1999

(51) Int. Cl.$^7$ ........................................................ G03F 7/32
(52) U.S. Cl. ................................................................ 430/331
(58) Field of Search ............................................. 430/331

(56) References Cited

U.S. PATENT DOCUMENTS

| | | | |
|---|---|---|---|
| 3,907,976 | 9/1975 | Walls | 204/38 A |
| 4,153,461 | 5/1979 | Berghäuser et al. | 430/160 |
| 4,259,434 | 3/1981 | Yamasue et al. | 430/302 |
| 4,452,880 | 6/1984 | Seino et al. | 430/309 |
| 4,458,005 | 7/1984 | Mohr et al. | 430/271 |
| 4,689,272 | 8/1987 | Simon et al. | 428/448 |
| 4,828,965 | * 5/1989 | West et al. | 430/331 |
| 4,927,741 | 5/1990 | Garth et al. | 430/309 |
| 5,340,699 | 8/1994 | Haley et al. | 430/302 |
| 5,372,907 | 12/1994 | Haley et al. | 430/157 |
| 5,466,557 | 11/1995 | Haley et al. | 430/278 |
| 5,491,046 | 2/1996 | De Boer et al. | 430/302 |
| 5,766,826 | 6/1998 | Miller et al. | 430/331 |
| 5,811,221 | 9/1998 | Miller et al. | 430/331 |
| 5,851,735 | 12/1998 | Miller et al. | 430/322 |
| 5,863,710 | * 1/1999 | Wakiya et al. | 430/331 |
| 5,897,985 | 4/1999 | Miller et al. | 430/325 |
| 5,914,217 | 6/1999 | Miller et al. | 430/302 |
| 5,958,655 | 9/1999 | Miller et al. | 430/331 |

FOREIGN PATENT DOCUMENTS 2276729  10/1994  (GB).

* cited by examiner

*Primary Examiner*—Hoa Van Le
(74) *Attorney, Agent, or Firm*—Ratner & Prestia

(57) ABSTRACT

The invention is aqueous alkaline composition comprising at least one alkali metal silicate, glycerol, at least one glycol and phosphoric acid and/or phosphates. The composition can be used as a developer and replenisher for developing either positive-working or negative-working alkaline developable lithographic printing plates (including thermal plates) independently of the interlayer present in the printing plate.

32 Claims, No Drawings

DEVELOPING SYSTEM FOR ALKALINE-DEVELOPABLE LITHOGRAPHIC PRINTING PLATES WITH DIFFERENT INTERLAYERS

FIELD OF THE INVENTION

This invention relates to developing systems useful for developing either positive-working or negative-working alkaline-developable lithographic printing plates (including thermal plates) having different interlayers. It also relates to a method for developing imagewise exposed printing plates.

BACKGROUND OF THE INVENTION

The art of lithographic printing is based upon the immiscibility of oil and water, in which oily material or ink is preferentially retained by the image areas and the water or fountain solution is preferentially retained by the non-image areas of the printing plate. When a suitably prepared surface is moistened with water and ink is applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket which in turn transfers the ink to the surface of the material upon which the image is to be reproduced.

Lithographic printing plates can be either negative-working or positive-working, and comprise one or more radiation-sensitive layers on a suitable substrate, such as metal or polymeric support. The radiation-sensitive layer generally includes one or more radiation-sensitive components that may be dispersed in a suitable binder. Alternatively, the radiation-sensitive component can also be the binder material. Certain useful printing plates can be used either as positive-working or negative-working.

A negative-working printing plate generally has a light sensitive layer composed of a radiation-sensitive component such as an unsaturated resin on a suitable substrate. Upon exposure to light, the exposed areas are hardened, leaving non-exposed areas removable during development. Certain negative-working printing plates contain novolac resins, a cross-linking agent, and a radiation-sensitive component that produces acid on exposure. By subsequently heating the plate, only the exposed areas are cured and the unexposed areas can be removed by a developer. The exposed, hardened areas are therefore oleophilic and will accept ink while the non-exposed underlying areas of the substrate are hydrophilic.

An alkaline developable positive-working printing plate generally has a light sensitive layer comprising a novolac resin and a radiation-sensitive component such as an o-diazoquinone or diazonaphthoquinone compound. Upon exposure to light the radiation-sensitive component is converted to the corresponding carboxylic acid. The use of an alkaline developer will remove only the exposed areas of the radiation-sensitive layer, leaving the surface of the support. Because the surface of the support is hydrophilic, the uncovered non-image area attracts water and repels the oily ink. The image area remaining after development is oleophilic thereby repelling water and attracting the printing ink.

Various aqueous solutions are known for use as developers for both positive-working and negative-working printing plates. For example, Yamasue, U.S. Pat. No. 4,259,434, describes use of a dispersion of a silicate to develop positive-working printing plates. These solutions include alkali metal silicates, in which the ratio of $SiO_2$ to M is from 0.5 to 0.75 ("M" being the alkali metal) at 1–4% $SiO_2$ concentration. However, many of such developers are overly active and attack or remove the unexposed image on the plates. Further, such developers attack the aluminum oxide layer and the aluminum on the back of the printing plate to such an extent that the developer activity decreases considerably and that sludging problems occur in the developing processor. The decrease in the developer activity due to its reaction with the carbon dioxide in air is significant as well. The replenishment rate of such developers is critical because the operational range of the developers is very narrow.

Seino, U.S. Pat. No. 4,452,880 describes silicate-containing developers in which the $SiO_2$ to alkali metal oxide ratios are much higher, that is between 1.6 and 2.0, and the % $SiO_2$ concentration is from 2 to 9%. These developers have relatively low activity, resulting in slow or incomplete development within the time suitable for practical commercial use. Thus, higher amounts of silicate must be included. Such higher amounts can be disadvantageous due to cost, residue on the plates and the potential for sludging in the processing equipment.

Miller, U.S. Pat. No. 5,851,735, discloses an aqueous alkaline developing composition that is useful in developing either positive-working or negative-working lithographic printing plates. The composition has a pH of at least 12 and comprises an alkali metal silicate and at least 6 wt % of a water-soluble or water-dispersible thickener, such as glycerol.

Toyama, GB-A-2,276,729 (DE-A4 411 176) discloses a developer or replenisher for both positive-working and negative-working lithographic printing plates comprising an alkali metal silicate and a water-soluble ethylene oxide adduct, obtained by addition of ethylene oxide to a sugar alcohol having not less than 4 hydroxy groups. This developer is stable and shows a high developing efficiency.

Offset printing plates usually have an interlayer between the commonly used aluminum substrate and the radiation-sensitive coating. Depending on the manufacturer, this interlayer consists of different materials; for example treatment of the substrate with silicate, dextrine, hexafluorosilicic acid, phosphate/fluoride, polyvinyl phosphonic acid or polyvinyl phosphonic acid copolymers is known. Methods for improving the hydrophilicity of the substrate (typically aluminum) are described, for example, in Berghauser, U.S. Pat. No. 4,153,461 (DE-A-16 21 478); Simon, U.S. Pat. No. 4,689,272 (EP-A-0 154 200); Walls, U.S. Pat. No. 3,902,976 (DE-A-25 32 769); and Mohr, U.S. Pat. No. 4,458,005 (DE-A-31 26 627). In practice, not every developer works well with every printing plate, especially with those that have different interlayers. The attack of a developer on the aluminum substrate and/or the aluminum oxide is depends on the composition of the developer. Therefore, printers who use printing plates with different interlayers must store and use a developer for each type of plate.

Consequently, there is a need for a developer that can be used effectively for developing printing plates with different kinds of interlayers. The developer should be able to develop both positive- and negative-working alkaline developable plates with a high throughput, it should have a small overflow rate, it should not produce any sludge, it should not attack the aluminum or alumina of the printing plate base, it should not attack the coating particularly in case of positive-working plates, and there should be no need for a special regenerator.

SUMMARY OF THE INVENTION

The invention is an aqueous alkaline composition that is useful as a developer for alkaline developable positive-working and negative-working lithographic printing plates, including thermal plates. The composition comprises, in addition to water:
(a) an alkali metal silicate component comprising at least one alkali metal silicate;
(b) glycerol;
(c) a glycol component comprising at least one glycol of formula I

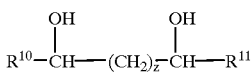
I in which $R^{10}$ and $R^{11}$ are each independently hydrogen or $C_1$–$C_3$ alkyl, and z is 0, 1, or 2; and
(d) a phosphate component comprising at least one member selected from the group consisting of phosphoric acid, primary phosphates, secondary phosphates, and tertiary phosphates.

The developer is alkaline (ie., pH greater than 7), typically having a pH of at least about 11, preferably at least about 12, and more preferably about 12 to about 14. In addition to these essential ingredients, the developer may comprise other conventional ingredients, such as phosphonic acid derivatives, polyglycol derivatives, and chelating agents.

In another embodiment, the invention is method of processing an imagewise exposed positive-working or negative-working lithographic printing plate with the developer. Usually, the printing plates developed by the developer comprise novolac and/or phenolic resins.

DETAILED DESCRIPTION OF THE INVENTION

Composition of the Developer

The developer of the invention is an aqueous alkaline composition that comprises, in addition to water
(a) an alkali metal silicate component comprising at least one alkali metal silicate;
(b) glycerol;
(c) a glycol component comprising at least one glycol of formula I

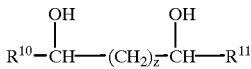
I in which $R^{10}$ and $R^{11}$ are each independently hydrogen or $C_1$–$C_3$ alkyl, and z is 0, 1, or 2; and
(d) a phosphate component comprising at least one member selected from the group consisting of phosphoric acid, primary phosphates, secondary phosphates, and tertiary phosphates.

The use of only one alkali metal silicate and only one glycol is preferred. However, a mixture of silicates and/or glycols can be used, if desired.

The developer comprises an alkali metal silicate component comprising at least one alkali metal silicate. The term "alkali metal silicate" as used in this application includes, but is not limited to, water glass, i.e. silicates with a molar ratio of $SiO_2$ to $M_2O$ (with M=alkali metal) of 2 or more, as well as alkali metal meta silicates, which have a molar ratio of $SiO_2$ to $M_2O$ of at most 1. Alkali metal meta silicates provide sufficient alkalinity to the developer. However, an additional alkali metal hydroxide must be used with water glass. Although both types of silicates can be used in the developer of the invention, alkali metal meta silicates is especially preferred. The most preferred alkali metal meta silicate is sodium meta silicate.

The amount of alkali metal silicate in the developer is generally at least about 10 grams $SiO_2$ per 1000 grams of developer, and preferably from about 20 to about 80 grams $SiO_2$/1000 grams of developer.

The second important component of the developer is glycerol ($CH_2OHCHOHCH_2OH$), which is also called glycerin or 1,2,3-propanetriol. Surprisingly, the combination of glycerol and one or more glycols provides a synergetic effect, reducing attack on the aluminum substrate by the developer effect independent of the type of interlayer present on the substrate.

The glycol component comprises one or more glycols of formula I. Preferably, the glycol component comprises a glycol selected from the group consisting of ethylene glycol, 1,2-propanediol, 1,3-propanediol and 1,2-butanediol.

The amount of glycol component plus glycerol is preferably from about 3 to about 16 wt %, based on the total weight of the developer, more preferably from about 8 to about 14 wt %. Although it is important that glycerol and the glycol component are present in the developer; the weight ratio of glycerol to the glycol component is not important. However, preferably neither glycerol nor the glycol component is present in an amount of less then about 0.5 wt %, based on the total weight of the developer. The glycol component comprises about 10 to 90 wt %, typically about 50 to 70 wt %, of the total weight of the glycol component and glycerol. Glycerol comprises about 10 to 90 wt %, typically 30 to 50 wt %, of the total weight of the glycol component and glycerol. Preferably, the glycol component comprises 55 to 65 wt % and glycerol comprises 35 to 45 wt % of the total weight of the glycol component and glycerol.

The developer also comprises a phosphate component, which comprises at least one member selected from phosphoric acid and phosphates. The term "phosphate component" includes phosphoric acid in addition to primary, secondary and tertiary phosphates. Preferably the phosphates are alkali metal or alkaline earth phosphates. Sodium phosphates are especially preferred. Although a single phosphate can be used, mixtures of phosphates, such as a mixture of primary sodium phosphate ($NaH_2PO_4$) and tertiary sodium phosphate ($Na_3PO_4$), are preferred. As is apparent to those skilled in the art, phosphates are formed from phosphoric acid in an alkaline composition, so it is also possible to use phosphoric acid instead of phosphates when preparing the developer.

The phosphate component is preferably about 0.2 to about 3 wt % (calculated as $P_2O_5$), based on the total weight of the developer, more preferably about 0.2 to about 1 wt %.

The phosphate component influences printing quality in a positive manner; toning can be reduced or eliminated by the presence of phosphates. Although not being bound by any theory or explanation, it is believed that the phosphates can protect the surface of the printing plate against oxide formation during printing.

It is further preferred that the developers comprise phosphonic acid derivatives. Phosphonic acid derivatives may function as corrosion inhibitors for aluminum. Together with phosphates and glycerol/glycol, phosphonic acid derivatives have a synergetic protective effect. Examples of phosphonic acid derivatives which may be added to the compositions of the invention are those of formula II below, especially hydroxyethanediphosphonic acid or suitable salts thereof, hexamethylenediaminotetra(methylenephosphonic acid) or suitable salts thereof, aminotri(methylenephosphonic acid) or suitable salts thereof; especially preferred is the use of sodium or potassium salts thereof.

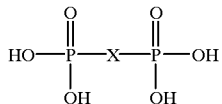

II in which X is $C_2$–$C_6$ alkylene or

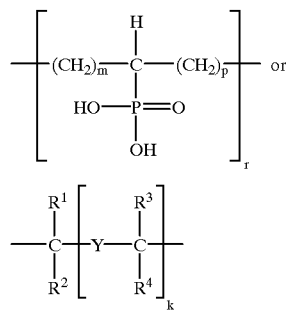

in which
k=0 or 1
m=1, 2, 3
p=1, 2, 3
r is an integer from 10–20
$R^1$ and $R^3$ are independently H or $C_1$–$C_4$ alkyl
$R^2$ and $R^4$ are independently H, OH or $C_1$–$C_4$ alkoxy
Y is —$R^6$N—$(CH_2)_n$—$(NR^5)_q$— with q=0 or 1, n being an integer from 0 to 8 and $R^5$ and $R^6$ being independently H, $C_1$–$C_4$ alkyl or —$CH_2$—$P(O)(OH)_2$.

In a preferred embodiment of the invention, phosphonic acid derivatives are used in an amount from about 0.01 to about 5 wt %; especially preferred the amount is from about 0.1 to about 1 wt %.

Further useful is the presence of polyglycol derivatives especially those of formula III

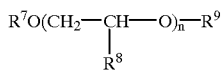

III in which $R^7$ is hydrogen or $C_1$–$C_8$ alkyl, $R^8$ is hydrogen, methyl or ethyl, $R^9$ is hydrogen or $CH_2COOH$ and n is an integer from 10 to 20.

They can protect the coating against overdevelopment by absorption. Preferably the polyglycol derivatives are selected from the group consisting of derivatives of polypropylene glycol ether, polyethylene glycol ether and polybutylene glycol ether. The amount of the polyglycol component is not limited, but in preferred embodiments it is from about 0.0005 to about 3 wt %; especially preferred the amount is from about 0.001 to about 0.6 wt %.

Furthermore, it is preferred that a complexing agent be added to the developer, especially if the developer is used in combination with and/or diluted with hard water; by the use of complexing agents the rolls are kept clean. Trilon® chelating agent (BASF) was commonly used in developers. However, it seems to attack the alumina in certain kinds of printing plates. Therefore, especially preferred complexing agents are carboxylic acid polymers like polymaleic acids as available from Polygon Chemie AG for instance under the tradename Sequion MS84.

The amount of the complexing agent depends on the hardness of the water used for diluting the composition and/or used in the printing process. Preferably it is used in an amount of about 0.05 to about 2 wt % based on the total developer.

The developer has an alkaline pH (i.e., greater than 7), typically at least about 11, preferably at least about 12, and more preferably about 12 to about 14. Alkalinity is provided using a suitable concentration of the alkali metal silicate or a silicate in combination with an alkali metal hydroxide.

Further, optional components of the developer include surfactants (anionic, nonionic and amphoteric) in a suitable amount (for example up to 5 wt % based on the total composition weight), biocides (antimicrobial or antifungal agent) and antifoaming agents, such as certain silicones. However, in preferred embodiments, neither a surfactant, an anti-foaming agent, nor a biocide is included in the developer.

The developer can be provided in a form ready for use with the concentrations of the components being as above, but it can also be provided in the form of a concentrate, which is diluted with water by the user prior to use.

Use of the Developer

In another embodiment, the invention is a method for providing an image by processing an imagewise exposed positive-working or negative-working lithographic printing plate using the developer of the invention. The method comprises developing an imagewise exposed alkaline developable positive-working or negative-working lithographic printing plate ding an alkaline developable positive-working or negative-working lithographic printing plate with the developer of the invention. In one embodiment, a positive-working printing plate is imagewise exposed using a suitable light source, making the exposed regions alkali soluble. The exposed regions are removed by the developer, revealing the underlying hydrophilic substrate.

Development of a positive-working printing plate according to this invention is generally conducted at a temperature of from about 18° to about 28° C. for a period of from about 5 to about 60 seconds.

The positive-working printing plates processed in the practice of this invention are any of those conventionally used in the art. An appropriate positive-working radiation-sensitive layer that includes a photosensitive component such as an o-diazoquinone, including an o-diazonapthoquinone compound as described in Gath, U.S. Pat. No. 4,927,741 and GB-2,082,339, is on the substrate.

Although these radiation-sensitive compounds can be used alone, more typically they are dispersed in a suitable binder material (or mixture thereof that is soluble in the developer. Such binder materials include, but are not limited to, novolac-type phenolic resins, and others readily apparent to one skilled in the art. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, pt-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions. Further additives can be included in the radiation-sensitive layer composition, including dyes, plasticizers, and components that give print-out properties.

In another embodiment of this invention, a negative-working alkaline developable printing plate, typically comprising a novolac and/or a phenolic resins, is imagewise exposed using a suitable light source, heated to a certain temperature, thus hardening the exposed regions. Accordingly, the non-exposed regions are washed away by the developer to reveal the hydrophilic substrate underneath. Especially useful are negative-working thermal plates that also contain an infrared radiation absorbing compound, rendering the radiation-sensitive layer infrared radiation (or heat) sensitive. Thus, a laser or other source of infrared radiation can be used to reduce solubility in exposed regions of the plate.

Such plates belong to the so-called direct-to-plate type. Direct-to-plate systems use digitized image information, which typically is stored on a computer disk or a computer tape. The bits of information in a digitized record correspond to the image elements or pixels of the image. This pixel record is used to control an exposure device, such as an infrared laser that produces beam of a modulated infrared radiation. The position of the exposure beam, in turn, may be controlled by a rotating drum, a leadscrew, or a turning mirror (flying spot apparatus). The exposure beam is turned on and off in correspondence with the pixels to be printed. The exposure beam is focused onto a presensitized, unexposed, lithographic printing plate. The exposed plate is submitted to any required processing steps, such as removal of unexposed material, washing, etc. to produce a lithographic printing plate ready for the printing press.

The direct-to-plate method of plate making is contrasted with the conventional method, which involves use of an exposed and processed film of the image to be printed. The film is contact-printed with ultraviolet radiation onto the sensitized, unexposed printing plate. The exposed plate is then processed by the required processing procedures. The direct-to-plate method of directly imaging a lithographic plate does not require the use of any film and, thus, contributes to savings in film costs and processing.

A variety of materials are known for the direct-to-plate method, as described, for example, in Haley, U.S. Pat. No. 5,340,699; Haley, U.S. Pat. No. 5,466,557; and DeBoer, U.S. Pat. No. 5,491,046. On the substrate is an appropriate negative-working thermal sensitive layer that includes a thermal sensitive component, in addition to a novolac resin, a resole resin, or both. Such materials are well known in the art, as described, for example, in Haley, U.S. Pat. No. 5,372,907. Further additives can be included in the radiation-sensitive layer composition, including dyes, plasticizers, Brönsted acid precursors, infrared radiation absorbing compounds, sensitizers, stabilizers, surfactants, and components that give printout properties, as are also well known in the art.

Development of a negative-working printing plate according to this invention is generally conducted at a temperature of from about 18 to about 28° C. for a period of from about 5 to about 60 seconds.

An advantage of the invention is that after developing of a certain number of plates, a fresh developer solution can be added to the container of the processor that contains the developer, no specific replenisher solution is necessary.

The radiation-sensitive composition of a printing plate is coated on a dimensionally stable substrate. Examples supports include paper, paper on which plastic (e.g. polyethylene, propylene, polystyrene) is laminated, a plate of metal such as aluminum (including aluminum alloys), zinc, copper, etc., plastic films (e.g., cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate, polyvinyl acetal), and a paper or plastic on which the metal as cited above is laminated. Of these supports, an aluminum plate is preferred over the others since It has markedly high dimensional stability and especially high adhesiveness to the photosensitive layers using the present photosensitive compositions, and is inexpensive. Also, a composite sheet formed by laminating an aluminum sheet on a plastic film can be used.

When a metal substrate, especially an aluminum plate, is used, it is desirable that the substrate undergo a surface treatment such as a graining treatment like brush graining and electrolytic graining, an anoidic oxidation treatment, etc. To further enhance the hydrophilic properties of the substrate surface, the support may further be coated with a silicate, fluorozirconate, a phosphate, a phosphate/fluoride interlayer or an organic compound selected from among carboxymethyl cellulose, dextrin, gum arabic, amino group-containing phosphonic acids, organic phosphonic acids including polyvinyl phosphoric acid, organic phosphates, amino acids, and hydroxyl group-containing amine hydrochlorides, etc. These compounds may be used as a mixture of two or more thereof.

It has been recognized that the developer solutions presently available attack the aluminum and/or alumina to a different degree depending on the kind of the interlayer present on the aluminum substrate.

INDUSTRIAL APPLICABILITY

The developer can be used to develop imagewise exposed positive-working or negative-working lithographic printing plates, independent of the type of interlayer present on the substrate. In addition, the developer can also be used to develop thermal printing plates. Thus, the invention allows the printer to use different kinds of printing plates without having to prepare, store, and use a variety of different developers.

The developer can also be used as its own replenisher (top-up), thus eliminating the need for specially formulated replenishing solution. The advantages of the developer are the usefulness for both positive-working and negative-working alkaline developable plates including thermal plates independently from the interlayer present. The developers allow the simultaneous development of different kinds of plates and all common developing processors can be used. Further advantages are the high plate through-put by constant developer activity for a long period of time without performance cutback caused by $CO_2$-absorption from the air, no attack of aluminum or alumina nor of the coating, a shorter exposure time with conventional positive-plates, no deposits of $SiO_2$, calcium and magnesium salts, no sludging and easy cleaning of the processor. Based on the high developing capacity only a low amount of solution is to be disposed which is an important contribution to environmental protection.

To obtain printing plates that produce optimal printing quality when used in lithographic printing processes it has so far been necessary to use different developer solutions for printing plates with different kinds of interlayers. Therefore, usually the seller of unexposed lithographic printing plates also sells a developer solution that is optimized for the use with a certain kind of printing plate but which generally does not yield optimum results when used with other printing plates, for example those of competitors. Consequently, the user of different printing plates from different suppliers has to use and store different developers, typically a different developer for each type of printing plate. This problem is overcome by the developer of the invention. As is shown in the examples below, the present developer can effectively be used for developing all alkaline developable printing plates, independently of the kind of interlayer present on the substrate.

The advantageous properties of this invention can be observed by reference to the following examples, which illustrate but do not limit the invention.

EXAMPLES

Glossary

| | |
|---|---|
| AKYPO ® LF6 | Polyethyleneglycol ether derivative (Chemy) |
| Pluriol P600 | Polypropyleneglycol ether (BASF) |
| Sequion 10 Na | Sodium salt of hydroxyethane diphosphonic acid (Polygon) |
| Sequion 50 K 33 | Potassium salt of hexamethylenediamino-tetra(methylenephosphonic acid) (Polygon) |
| Sequion MS 84 | Carboxylic acid polymer (Polygon) |

Example 1

Preparation of developer 1

A developer was prepared from the following components under stirring:

| | |
|---|---|
| 73.8 kg | water |
| 10.44 kg | sodium meta silicate × 5 $H_2O$ |
| 1.97 kg | trisodium phosphate × 12 $H_2O$ |
| 0.12 kg | monosodium phosphate |
| 0.20 kg | Sequion 10 Na |
| 0.22 kg | Sequion MS 84 |
| 0.05 kg | Pluriol P600 |
| 7.70 kg | ethylene glycol |
| 5.50 kg | glycerol |

The developer was filtered and stored in a closed container prior to use.

Example 2

Preparation of developer 2

A developer was prepared from the following components under stirring:

| | |
|---|---|
| 70.8 kg | water |
| 13.44 kg | sodium meta silicate × 5 $H_2O$ |
| 1.97 kg | trisodium phosphate × 12 $H_2O$ |
| 0.12 kg | monosodium phosphate |
| 0.20 kg | Sequion 50K33 |
| 0.22 kg | Sequion MS 84 |
| 0.05 kg | Pluriol P600 |
| 7.70 kg | ethylene glycol |
| 5.50 kg | glycerol |

The developer was filtered and stored in a closed container prior to use.

Example 3

Preparation of developer 3

A developer is prepared from the following components under stirring:

| | |
|---|---|
| 61.91 kg | water |
| 23.20 kg | potassium meta silicate (45% solution) |
| 1.10 kg | tripotassium phosphate |
| 0.12 kg | monopotassium phosphate |
| 0.20 kg | Sequion 10 Na |
| 0.22 kg | Sequion MS 84 |
| 0.05 kg | Pluriol P600 |
| 7.70 kg | ethylene glycol |
| 5.50 kg | glycerol |

The developer was filtered and stored in a closed container prior to use.

Example 4

Preparation of developer 4

A developer was prepared from the following components under stirring:

| | |
|---|---|
| 73.8 kg | water |
| 10.44 kg | sodium meta silicate × 5 $H_2O$ |
| 1.97 kg | trisodium phosphate × 12 $H_2O$ |
| 0.12 kg | monosodium phosphate |
| 0.20 kg | Sequion 10 Na |
| 0.22 kg | Sequion MS 84 |
| 0.05 kg | poly(propylene glycol) 425 (Aldrich) |
| 7.70 kg | 1,2-Propanediol |
| 5.50 kg | glycerol |

The developer was filtered and stored in a closed container prior to use.

Example 5

Preparation of developer 5

A developer was prepared from the following components under stirring:

| | |
|---|---|
| 73.8 kg | water |
| 10.44 kg | sodium meta silicate × 5 $H_2O$ |
| 1.97 kg | trisodium phosphate × 12 $H_2O$ |
| 0.12 kg | monosodium phosphate |
| 0.20 kg | Sequion 10 Na |
| 0.22 kg | Sequion MS 84 |
| 0.05 kg | AKYPO ® LF6 |
| 7.70 kg | ethylene glycol |
| 5.50 kg | glycerol |

The mixture was filtered and stored in a closed container prior to use.

Comparative Examples 1–9

Developers were prepared under stirring from the components shown in Table 1. Each developer was filtered and stored in a closed container prior to use.

TABLE 1

| Ingredients | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Ex. 1 |
|---|---|---|---|---|---|---|---|---|---|---|
| Water demineralized | 89.29 | 87.2 | 89.09 | 87 | 83.79 | 76.09 | 81.59 | 76.09 | 76.09 | 73.8 |
| Sodium meta silicate 5H$_2$O | 10.44 | 10.44 | 10.44 | 10.44 | 10.44 | 10.44 | 10.44 | 10.44 | 10.44 | 10.44 |
| Sequion MS 84 | 0.22 | 0.22 | 0.22 | 0.22 | 0.22 | 0.22 | 0.22 | 0.22 | 0.22 | 0.22 |
| Pluriol P600 | 0.05 | 0.05 | 0.05 | 0.05 | 0.05 | 0.05 | 0.05 | 0.05 | 0.05 | 0.05 |
| Tri-sodium-phosphate | — | 1.97 | — | 1.97 | — | — | — | — | — | 1.97 |
| Mono-sodium-phosphate | — | 0.12 | — | 0.12 | — | — | — | — | — | 0.12 |
| Sequion 10 Na | — | — | 0.2 | 0.2 | — | — | — | — | — | 0.2 |
| Glycerol | — | — | — | — | 5.5 | 13.2 | — | — | 5.5 | 5.5 |
| Ethylene Glycol | — | — | — | — | — | — | 7.7 | 13.2 | 7.7 | 7.7 |
| | 100 kg | 100 kg | 100 kg | 100 kg | 100 kg | 100 kg | 100 kg | 100 kg | 100 kg | 100 kg |

Comparative Example 10 (according to EP 0 274 044)

A developer was prepared from the following components under stirring:

```
  79.3   kg  water
  15.0   kg  sodium meta silicate × 5 H2O
   2.0   kg  Borax
   2.5   kg  TRITON ® H66 (50% aqueous solution of a phosphate
              ester; Rohm & Haas)
   0.2   kg  SYNPERONIC ® T 304 (liquid block copolymer; I.C.I.)
   0.02  kg  TRITON ® CF-32 (95% aqueous solution of an amine
              ethoxylate; Rohm & Haas)
   0.0036 kg Cibacron Golden Yellow 2R
   0.0004 kg Cibacron Red 6B
   1.0   kg  BRIQUEST ® 810625S (25% aqueous solution of sodium
              pentaethylene hexamine octakis (methylene phosphonate);
              Albright & Wilson)
```

The developer was filtered and stored in a closed container prior to use.

Exposure and development of the positive-working printing plates

The positive working printing plates Virage™ (interlayer: polyvinyl phosphonic acid) and CAPRICORN® (interlayer: phosphate/fluoride), which are processed in the following further examples, are commercially available from Kodak Polychrome Graphics LLC. They have been cut to a size of 790×850 mm and exposed by a metal halide lamp (MH-Burner, Theimer) with 530 mJ/cm$^2$ (Virage™) and 420 mJ/cm$^2$ (CAPRICORN®) under a silver film half-step wedge (test strips from Fogra) with a density range of 0.15 to 1.95, in which the density increments are 0.15, as a positive copy.

A commercially available developing processor (Sprinter 72, Kodak Polychrome Graphics LLC), equipped with a developing bath of the immersion type, a section for rinsing with water, a gumming and drying section, was used for developing the above-mentioned imagewise exposed plates. The developing processor was filled with 25 L of the respective developer solution (obtained in Examples 1–5 above). If the processor contained more than the given volume of 25 L, the excess was removed via an overflow. This excess can be caught in a container. Separately, a container for the top-up (replenisher) was filled with the developer. A predetermined amount of developer per square meter of exposed plate was added to the developer in the processor via a pump.

The activity of the developer was examined by titration of the amount of alkali. To determine the alkali content, 5 mL of the developer was removed from the developing bath, 95 mL of deionized water was added and titration was carried out with 0.5 N HCl (Titrino DMS 716, Metrohm). The number of mL used until the first equivalence point was reached is referred to as alkali value. The following parameters were kept constant in all tests:

| | |
|---|---|
| temperature of the developing bath: | (23 ± 1)° C. |
| dwell time in the developer: | 25 sec |

To evaluate the copies obtained after development, the following criteria were examined: steps of the gray wedge that are not covered at all (in the following referred to as GW), microlines that have not yet been attacked (in the following referred to as ML), behavior during the print proof or during restarting of the printing (ink acceptance problems of the image and non-image areas).

To obtain the latter test results, the exposed and developed plates were mounted in a sheet-fed offset press and proofed. The image areas accepted ink without any problems and the paper copies did not show any background (referred to as toning) in the non-image areas. After about 1000 copies, the press was stopped for about 30 minutes and then restarted (restarting test). The same results as at the beginning of the printing test were obtained. In particular the non-image areas did not show any toning, which indicates a good protection of the basis material by the developed.

Copying results with the developers of the invention

The copying results obtained with the developers of the invention are listed in Table 2 below. As can be seen, the different developers yield nearly identical results in both examined plates as regards gray wedge and microline resolution. The slight differences obtained with developer 1 are due to its slightly elevated alkali value (6.5 mL) compared to those of the other developers (6.2 to 6.3 mL).

TABLE 2

| Parameter | Example 1 | Example 2 | Example 3 | Example 4 | Example 5 |
|---|---|---|---|---|---|
| Virage ™ | | | | | |
| GK | 3/4 | 3 | 3 | 3 | 3 |
| ML | 12/15 | 12 | 12 | 12 | 12 |
| print | no toning | no toning | no toning | no toning | no toning |

TABLE 2-continued

| Parameter | Example 1 | Example 2 | Example 3 | Example 4 | Example 5 |
|---|---|---|---|---|---|
| CAPRICORN® | | | | | |
| GK | 3/4 | 3 | 3 | 3 | 3 |
| ML | 12/15 | 12 | 12 | 12 | 12 |
| print | no toning | no toning | no toning | no toning | no toning |

Stability and load tests of Virage™ plates

Virage™ plates that had been exposed with the UGRA wedge in the same manner as described above were developed one after another at a rate of 150 plates per day for 25 days (plus 4 weekend interruptions) in the Sprinter 72 automatic developing processor. The quality of the resulting copies was evaluated in terms of the GW and ML values. The activity of the developer was monitored at a throughput of 4 $m^2/L$ by the titration of 0.5 N HCl.

The results for developer 1 are listed in Table 3 below. As can be seen from the titration data, the activity of the developer can be kept constant during the long testing period by means of top-up (addition of developer) in the amount of 100 $mL/m^2$ of the developed plate. This also becomes apparent in the almost constant values for the copy parameters after the development of 775 $m^2$ plates in the 25 L developer of the processor. Throughout the course of the test, 54 L of overflow of used developer was collected, which corresponds to a value of 70 $mL/m^2$ (30 $mL/m^2$ are removed).

During the test period, the developing process of the Virage™ plates was not affected by the formation of foam nor by the precipitation of insoluble material on the bottom of the processor. After the testing was completed, the processor could easily be cleaned by rinsing with water and no residue remained. After a throughput of 10, 20 and 31 $m^2/L$ Virage™ plates did not show any irregularities in the printing test. Neither ink acceptance nor toning problems occurred.

TABLE 3

| Throughput ($m^2/L$) | G/K | $\mu$ - Lines | Top-Up ($mL/m^2$) | Titration (mL 0.5 N HCl) |
|---|---|---|---|---|
| 0 | 3/8 | 12–15 | 100 | 6.5 |
| 2 | 3/8 | 12–15 | 100 | 6.3 |
| 4 | 3/8 | 12–15 | 100 | 6.2 |
| 6 | 3/8 | 12–15 | 100 | 6.0 |
| 8 | 3/8 | 12–15 | 100 | 6.0 |
| 10 | 3/8 | 12–15 | 100 | 5.9 |
| 12 | 3/8 | 12–15 | 100 | 6.0 |
| 14 | 3/8 | 12–15 | 100 | 5.9 |
| 16 | 3/8 | 12–15 | 100 | 6.1 |
| 18 | 3/8 | 12–15 | 100 | 5.9 |
| 20 | 3/8 | 12–15 | 100 | 6.0 |
| 22 | 3/8 | 12–15 | 100 | 5.8 |
| 24 | 3/8 | 12–15 | 100 | 5.9 |
| 26 | 3/8 | 12–15 | 100 | 5.8 |
| 28 | 3/8 | 12–15 | 100 | 6.0 |
| 30 | 3/8 | 12–15 | 100 | 5.9 |
| 31 | 3/8 | 12–15 | 100 | 5.9 |

Stability and load tests of CAPRICORN® plates

CAPRICORN® plates that had been exposed with the UGRA wedge in the same manner as described above were developed one after another at a rate of 150 plates per day for 25 days (plus 4 weekend interruptions) in the Sprinter 72 automatic developing processor. The quality of the resulting copies was evaluation in terms of the GW and ML values. The activity of the developer was monitored at a throughput of 4 $m^2/L$ by the titration of 0.5 N HCl.

The results for developer 1 are listed in Table 4 below. As can be seen from the titration data, the activity of the developer can be kept constant during the long testing period by means of top-up (addition of developer) in the amount of 100 $mL/m^2$ of the developed plate. This also becomes apparent in the almost constant values for the copy parameters after the development of 775 $m^2$ plates in the 25 L developer of the processor. Throughout the course of the test, 54 L of overflow of used developer was collected, which corresponds to a value of 70 $mL/m^3$. During the test period, neither formation of foam nor precipitation of insoluble material on the bottom of the processor affected the developing process of the CAPRICORN® plates. After the testing was completed, the processor could easily be cleaned by rinsing with water and no residue remained. After a throughput of 10, 20 and 31 $m^2/L$ CAPRICORN® plates did not show any irregularities in the printing test. Neither ink acceptance nor toning problems occurred.

TABLE 4

| Throughput ($m^2/L$) | G/K | $\mu$ - Lines | Top-Up ($mL/m^2$) | Titration (mL 0.5 N HCl) |
|---|---|---|---|---|
| 0 | 3/8 | 12–15 | 100 | 6.5 |
| 2 | 3/8 | 12–15 | 100 | 6.2 |
| 4 | 3/8 | 12–15 | 100 | 6.2 |
| 6 | 3/8 | 12–15 | 100 | 6.1 |
| 8 | 3/8 | 12–15 | 100 | 6.0 |
| 10 | 3/8 | 12–15 | 100 | 5.9 |
| 12 | 3/8 | 12–15 | 100 | 5.9 |
| 14 | 3/8 | 12–15 | 100 | 6.0 |
| 16 | 3/8 | 12–15 | 100 | 6.0 |
| 18 | 3/8 | 12–15 | 100 | 6.1 |
| 20 | 3/8 | 12–15 | 100 | 6.0 |
| 22 | 3/8 | 12–15 | 100 | 5.9 |
| 24 | 3/8 | 12–15 | 100 | 5.8 |
| 26 | 3/8 | 12–15 | 100 | 6.0 |
| 28 | 3/8 | 12–15 | 100 | 5.8 |
| 30 | 3/8 | 12–15 | 100 | 5.9 |
| 31 | 3/8 | 12–15 | 100 | 6.0 |

Developing with a plate mix

In order to determine whether the coating components of Virage™ and CAPRICORN® plates contained in a used developer affects the development of the other plate, the following cross tests were carried out:

(1) In developer 1, in which 20 $m^2/L$ Virage™ plates had been developed (cf. Table 3 above), 20 $m^2$ exposed CAPRICORN® plates were subsequently developed. Both the copy values and the printing properties of the thus developed CAPRICORN® plates corresponded to standard values. Furthermore, no precipitation was observed in the developing processor.

(2) In developer 1, in which 20 $m^2/L$ CAPRICORN® plates had been developed (cf. Table 4 above), 20 $m^2$ exposed Virage™ plates were subsequently developed. Both the copy values and the printing properties of the thus developed Virage™ plates corresponded to standard values. Furthermore, no precipitation was observed in the developing processor.

Developing Virage™, CAPRICORN® and RP plates with the Developers of the Comparative Examples Virage™ plates, CAPRICORN® plates, and RP plates; interlayer Lomar substrate, i.e. condensation product of formaldehyde and naphthalene sulphonic acid) were developed in the same manner as described above in the developing processor with the developers listed in Comparative Examples 1 to 4. Plates were also developed manually after a soak time of 5 minutes. In each case the copy parameters and the attack on aluminum oxide (front side of the plate) were determined. An aluminum cover with a size of 1 dm² was put in the developer for 5 minutes and the aluminum attack was determined gravimetrically. The results are listed in Table 5 for Virage® plates, in Table 6 for CAPRICORN® plates and in Table 7 for RP plates.

It was found that although the copy results after a short soak time of 25 sec are identical for almost all the tested developers, there are clear differences after a soak time of 5 minutes. These differences are due to the $Al/Al_2O_3$ attack by the developers and indicate the improvement achieved by the developers of the invention.

A stability and load test of Comparative Example 10, carried out in the same manner as that of the developers 1 and 2 according to the invention, provided the following results:

(1) At a plate throughput of up to 4 m²/L, top-up amounts of 180 mL/m² of developer are necessary in order to keep the titration (activity) of the developer bath somewhat constant.

(2) Additionally, at a higher plate throughput, the soak time has to be continuously increased so that the standard copy parameters can be achieved.

(3) At a plate throughput of about 15 m²/L, a precipitate was formed in the processor.

(4) At a plate throughput of about 20 m²/L, the developer in the processor has to be exchanged since the standard copy parameters are no longer obtained and the formation of precipitate is so strong that the plates are soiled.

A comparison with the results of Table 3 above shows a clear improvement of the plate throughput and a decrease in the overflow amount (150 mL/m² in the comparative composition compared to 70 mL/m² in developer solution 1) due to the use of the developers according to the invention.

TABLE 5

|  | 25 s. soak time | | 5 min. soak time | |
| --- | --- | --- | --- | --- |
|  | GS | μ-Lines | GS | μ-Lines |
| Example 1 | 3/4 | 12/15 | 7 | 15/20 |
| Comp. Example 1 | 3/4 | 12/15 | 7 | 15/20 |
| Comp. Example 2 | 3/4 | 12/15 | 7 | 15/20 |
| Comp. Example 4 | 3/4 | 12/15 | 7 | 15/20 |
| Comp. Example 10 | 3/4 | 12/15 | >13 | >70 |

TABLE 6

|  | 25 s. soak time | | 5 min. soak time | |
| --- | --- | --- | --- | --- |
|  | GS | μ-Lines | GS | μ-Lines |
| Example 1 | 3/4 | 12/15 | 7 | 15/20 |
| Comp. Example 1 | 3/4 | 12/15 | 7 | 15/20 |
| Comp. Example 2 | 3/4 | 12/15 | 7 | 15/20 |
| Comp. Example 4 | 3/4 | 12/15 | 7 | 15/20 |
| Comp. Example 10 | 3/4 | 12/15 | >13 | >70 |

TABLE 7

|  | 25 s. soak time | | 5 min. soak time | |
| --- | --- | --- | --- | --- |
|  | GS | μ-Lines | GS | μ-Lines |
| Example 1 | 3/4 | 12/15 | 7 | 15/20 |
| Comp. Example 1 | 3/4 | 12/15 | 7 | 15/20 |
| Comp. Example 2 | 3/4 | 12/15 | 7 | 15/20 |
| Comp. Example 3 | 3/4 | 12/15 | 7 | 15/20 |
| Comp. Example 4 | 3/4 | 12/15 | >13 | >70 |

Aluminum Attack Test

In this test, the amount of aluminum removed by various developers was gravimetrically measured by comparing the initial weight of an aluminum disc having a certain interlayer but no radiation-sensitive layer with the weight of the disc after it laid in the developer for 5 minutes at 20° C. The results are shown in Table 8.

As is apparent from Table 8, at both substrates there is no or only a slight attack on the aluminum when using the developer according to the invention while those of the developers of Comparative Examples 1–9 result in a significant attack at both substrates.

TABLE 8

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Goldstar commercial developer | Ex. 1 |
| --- | --- | --- | --- | --- | --- | --- | --- | --- | --- | --- | --- |
| Attack on Phosphate/Fluoride Substrate after 5 min., in mg/2 dm² (CAPRICORN ® Substrate) | 4.2 | 4.2 | 4.2 | 3.4 | 2.6 | 2.6 | 1.8 | 1.8 | 0.9 | 4.5 | 0.1 |
| Attack on PVPA Substrate after 5 min in mg/2 dm² (Virage ™ Substrate) | 12.0 | 7.8 | 12.0 | 6.6 | 5.7 | 5.7 | 4.2 | 4.2 | 2.1 | 17.2 | 0.0 |

Aluminum Oxide Attack Test

In this test the attack on aluminum oxide was determined for aluminum substrates with three different interlayers. The results are shown in Table 9.

TABLE 9

| Developer | Oxide Attack on PVPA Substrate | Oxide Attack on PVPA Copolymer Substrate | Oxide Attack on Phosphate/Fluoride Substrate |
|---|---|---|---|
| Goldstar commercial developer according to EP 0 274 044 A1 | yes | yes | no |
| Silverstar commercial developer from Kodak Polychrome Graphics | yes | yes | no |
| Greenstar commercial developer from Kodak Polychrome Graphics | yes | yes | no |
| DE 507 commercial developer from Kodak Polychrome Graphics | yes | yes | no |
| DE 508 commercial developer from Kodak Polychrome Graphics | yes | yes | no |
| DE 506 commercial developer from Kodak Polychrome Graphics | yes | yes | no |
| 907 F commercial developer from Kodak Polychrome Graphics | yes | yes | no |
| Example 1 | no | no | no |

As is apparent from Table 9, the developer according to the invention is the only one that shows no aluminum oxide attack with all three tested substrates.

Having described the invention, we now claim the following and their equivalents.

What is claimed is:

1. A composition useful as a developer for alkaline-developable lithographic printing plates in which the composition is an aqueous alkaline composition comprising:
    (a) an alkali metal silicate component comprising at least one alkali metal silicate;
    (b) glycerol;
    (c) a glycol component comprising at least one glycol of formula I

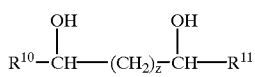

in which $R^{10}$ and $R^1L$ are each independently hydrogen or $C_1$–$C_3$ alkyl, and z is 0, 1, or 2; and
    (d) a phosphate component comprising at least one member selected from the group consisting of phosphoric acid, primary phosphates, secondary phosphates, and tertiary phosphates, in which:
    the alkali metal silicate component is at least about 10 g $SiO_2$ per 1000 g of the total weight of the composition;
    the amount of glycerol plus the amount of glycol component is from about 3 wt % to about 16 wt %, based on the total weight of the composition; and
    neither the glycerol nor the glycol component is present in an amount less than 0.5 wt %, based on the total weight of the composition; and
    the amount of the phosphate component is from about 0.2 to about 3 wt %, calculated as $P_2O_5$ based on the total weight of the composition.

2. The composition of claim 1 in which the glycol component comprises about 10 to 90 wt % of the total weight of the glycol component and glycerol, and glycerol comprises about 10 to 90 wt % of the total weight of the glycol component and glycerol.

3. The composition of claim 1 in which the glycol component comprises at least one glycol selected from the group consisting of ethylene glycol, 1,2-propanediol, 1,3-propanediol and 1,4-butanediol.

4. The composition of claim 1 in which the pH of the composition is about 12 to about 14.

5. The composition of claim 1 further comprising at least one component selected from the group consisting of phosphonic acid derivatives, polyglycol derivatives, and complexing agents.

6. The composition of claim 1 further comprising at least one additive selected from the group consisting of surfactants, biocides, and antifoaming agents.

7. The composition of claim 1 in which:
    the glycol component comprises about 10 to 90 wt % of the total weight of the glycol component and glycerol, and glycerol comprises about 10 to 90 wt % of the total weight of glycol component and glycerol;
    the glycol component comprises at least one glycol selected from the group consisting of ethylene glycol, 1,2-propanediol, 1,3-propanediol and 1,4-butanediol; and
    the pH of the composition is greater than at least about 12.

8. The composition of claim 7 in which:
    the glycol component comprises about 50 to 70 wt % of the total weight of the glycol component and glycerol and glycerol comprises about 30 to 50 wt % of the total weight of glycol component and glycerol, and
    the pH of the composition is about 12 and about 14.

9. The composition of claim 1 in which the alkali metal silicate is sodium meta silicate.

10. The composition of claim 1 in which the glycol component is ethylene glycol.

11. The composition of claim 1 in which the glycol component comprises about 50 to 70 wt % of the total weight of the glycol component and glycerol, and glycerol comprises about 30 to 50 wt % of the total weight of the glycol component and glycerol.

12. The composition of claim 11 further comprising at least one component selected from the group consisting of phosphonic acid derivatives, polyglycol derivatives, and complexing agents.

13. The composition of claim 11 in which the glycol component is ethylene glycol.

14. The composition of claim 8 in which the glycol component is ethylene glycol.

15. The composition of claim 1 in which the glycol component comprises about 55 to 65 wt % of the total weight of the glycol component and glycerol, and glycerol comprises about 35 to 55 wt % of the total weight of the glycol component and glycerol.

16. The composition of claim 15 in which the glycol component is ethylene glycol.

17. The composition of claim 16 in which the pH of the composition is about 12 to about 14.

18. The composition of claim 17 in which the alkali metal silicate component is from about 20 to about 80 grams of SiO$_2$/1000 grams of the composition and the alkali metal silicate is sodium meta silicate.

19. A method for processing, comprising:

developing an imagewise exposed lithographic printing plate with an aqueous alkaline developing composition comprising:

(a) an alkali metal silicate component comprising at least one alkali metal silicate;

(b) glycerol;

(c) a glycol component comprising at least one glycol of formula I

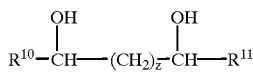

I in which $R^{10}$ and $R^{11}$ are each independently hydrogen or $C_1$–$C_3$ alkyl, and z is 0, 1, or 2; and (d) a phosphate component comprising at least one member selected from the group consisting of phosphoric acid, primary phosphates, secondary phosphates, and tertiary phosphates, in which:

the alkali metal silicate component is at least about 10 g SiO$_2$ per 1000 g of the total weight of the composition;

the amount of glycerol plus the amount of glycol component is from about 3 wt % to about 16 wt %, based on the total weight of the composition; and neither the glycerol nor the glycol component is present in an amount less than 0.5 wt %, based on the total weight of the composition; and the amount of the phosphate component is from about 0.2 to about 3 wt %, calculated as P$_2$O$_5$ based on the total weight of the composition.

20. The method of claim 19 in which the glycol component comprises about 10 to 90 wt % of the total weight of the glycol component and glycerol, and glycerol comprises about 10 to 90 wt % of the total weight of the glycol component and glycerol.

21. The method of claim 19 in which the glycol component comprises at least one glycol selected from the group consisting of ethylene glycol, 1,2-propanediol, 1,3-propanediol and 1,4-butanediol.

22. The method of claim 19 in which:

the glycol component comprises about 10 to 90 wt % of the total weight of the glycol component and glycerol, and glycerol comprises about 10 to 90 wt % of the total weight of glycol component and glycerol;

the glycol component comprises at least one glycol selected from the group consisting of ethylene glycol, 1,2-propanediol, 1,3-propanediol and 1,4-butanediol; and the pH of the composition is at least about 12.

23. The method of claim 22 in which:

the glycol component comprises about 50 to 70 wt % of the total weight of the glycol component and glycerol, and glycerol comprises about 30 to 50 wt % of the total weight of the glycol component and glycerol; and the pH of the composition is about 12 and about 14.

24. The method of claim 19 in which the printing plate comprises an aluminum or a treated aluminum substrate.

25. The method of claim 24 in which the substrate is coated with a silicate interlayer, a fluorozirconate interlayer, a phosphate interlayer, a phosphate/fluoride interlayer, or an organic compound selected from the group consisting of carboxymethyl cellulose, dextrine, gum arabic, amino group-containing phosphonic acids, organic phosphonic acids, organic phosphates, amino acids and hydroxyl group-containing amine hydrochlorides.

26. The method of claim 24 in which the printing plate is a negative-working, heat-sensitive printing plate comprising a negative-working radiation-sensitive composition comprising an infrared radiation absorbing compound.

27. The method of claim 26 in which:

the glycol component comprises about 10 to 90 wt % of the total weight of the glycol component and glycerol, and glycerol comprises about 10 to 90 wt % of the total weight of glycol component and glycerol;

the glycol component comprises at least one glycol selected from the group consisting of ethylene glycol, 1,2-propanediol, 1,3-propanediol and 1,4-butanediol; and the pH of the composition is at least about 12.

28. The method of claim 27 in which:

the glycol component comprises about 50 to 70 wt % of the total weight of the glycol component and glycerol, and glycerol comprises about 30 to 50 wt % of the total weight of the glycol component and glycerol; and the pH of the composition is about 12 and about 14.

29. The method of claim 19 additionally comprising, after the developing step, the step of adding an additional amount of the aqueous alkaline developing composition.

30. The method of claim 29 in which the printing plate is a negative-working, heat-sensitive printing plate comprising a negative-working radiation-sensitive composition comprising an infrared radiation absorbing compound.

31. The method of claim 30 in which:

the glycol component comprises about 10 to 90 wt % of the total weight of the glycol component and glycerol, and glycerol comprises about 10 to 90 wt % of the total weight of the glycol component and glycerol;

the glycol component comprises at least one glycol selected from the group consisting of ethylene glycol, 1,2-propanediol, 1,3-propanediol and 1,4-butanediol; and the pH of the composition is greater than at least about 12.

32. The method of claim 31 in which:

the glycol component comprises about 50 to 70 wt % of the total weight of the glycol component and glycerol, and glycerol comprises about 30 to 50 wt % of the total weight of the glycol component and glycerol; and the pH of the composition is about 12 and about 14.

* * * * *

UNITED STATES PATENT AND TRADEMARK OFFICE
CERTIFICATE OF CORRECTION

PATENT NO. : 6,255,042 B1
DATED : July 3, 2001
INVENTOR(S) : Fiebag et al.

It is certified that error appears in the above-identified patent and that said Letters Patent is hereby corrected as shown below:

Column 6,
Lines 34-35, delete "plate ding an alkaline developable positive-woking or negative-working lithographic printing plate" and insert therefor -- plate --

Column 17,
Line 57, delete "$R^1L$" and insert therefor -- $R^{11}$ --

Column 18,
Line 37, delete "glycerol" and insert therefor -- glycerol, --
Line 41, delete "and" and insert therefor -- to --

Column 20,
Line 34, delete "and" and insert therefor -- to --
Line 59, delete "and" and insert therefor -- to --

Signed and Sealed this

Fourteenth Day of May, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.   : 6,255,042 B1
DATED        : July 3, 2001
INVENTOR(S)  : Ulrich Fiebag et al.

It is certified that error appears in the above-identified patent and that said Letters Patent is hereby corrected as shown below:

<u>Title page,</u>
Item [75], Inventors, delete "Tondock Uwe" and insert therefor -- Uwe Tondock --.

Signed and Sealed this

Tenth Day of September, 2002

Attest:

Attesting Officer

JAMES E. ROGAN
*Director of the United States Patent and Trademark Office*